US008817469B2

(12) United States Patent
Macall

(10) Patent No.: US 8,817,469 B2
(45) Date of Patent: Aug. 26, 2014

(54) HEAT TRANSFER USING A DURABLE LOW-FRICTION INTERFACE

(75) Inventor: Thomas George Macall, San Jose, CA (US)

(73) Assignee: Infinera Corporation, Sunnyvale, CA (US)

(*) Notice: Subject to any disclaimer, the term of this patent is extended or adjusted under 35 U.S.C. 154(b) by 191 days.

(21) Appl. No.: 13/241,441

(22) Filed: Sep. 23, 2011

(65) Prior Publication Data
US 2013/0077253 A1 Mar. 28, 2013

(51) Int. Cl.
*H05K 7/20* (2006.01)
(52) U.S. Cl.
CPC ........ *H05K 7/20454* (2013.01); *H05K 7/20545* (2013.01); *H05K 7/20418* (2013.01)
USPC ............ 361/690; 361/704; 361/708; 361/715
(58) Field of Classification Search
None
See application file for complete search history.

(56) References Cited

U.S. PATENT DOCUMENTS

| 6,186,376 | B1 * | 2/2001 | Hyun | 223/1 |
| 6,980,437 | B2 * | 12/2005 | Bright | 361/704 |
| 7,859,849 | B2 * | 12/2010 | Ice | 361/715 |
| 7,974,098 | B2 * | 7/2011 | Oki et al. | 361/715 |
| 8,081,470 | B2 * | 12/2011 | Oki et al. | 361/715 |
| 8,345,445 | B2 * | 1/2013 | Del Prete et al. | 361/804 |
| 8,449,203 | B2 * | 5/2013 | Downs | 385/92 |
| 2003/0161108 | A1 * | 8/2003 | Bright et al. | 361/707 |
| 2005/0195565 | A1 * | 9/2005 | Bright | 361/688 |
| 2010/0067196 | A1 * | 3/2010 | Costello et al. | 361/704 |

OTHER PUBLICATIONS

ASTM International, "Standard Specification for Autocatalytic Nickel Boron Coatings for Engineering Use", Designation: B607-91 (Reapproved Sep. 1, 2009), 6 pages.
Military Specification "Coatings, Electroless Nickel Requirements for", MIL-C-26074E, Oct. 30, 1990, 11 pages.

* cited by examiner

*Primary Examiner* — Gregory Thompson
(74) *Attorney, Agent, or Firm* — Harrity & Harrity LLP; David L. Soltz

(57) ABSTRACT

A system includes a removable module to process data when installed in the system, where the module includes a first surface via which heat, that is generated by the module, is transferred. The system also includes a port into which the module is installed; and a heat sink, associated with the port, to dissipate the heat received from the first surface, where the heat sink includes a second surface on which a material is applied, and where the material makes contact with the first surface when the module is installed that allows the heat to be received from the first surface, conforms to an American Society for Testing Materials (ASTM)-B607-91 standard or a United States military specification-C-26074, and transfers the heat to the second surface that allows the module to operate at a temperature that is less than a threshold.

22 Claims, 5 Drawing Sheets

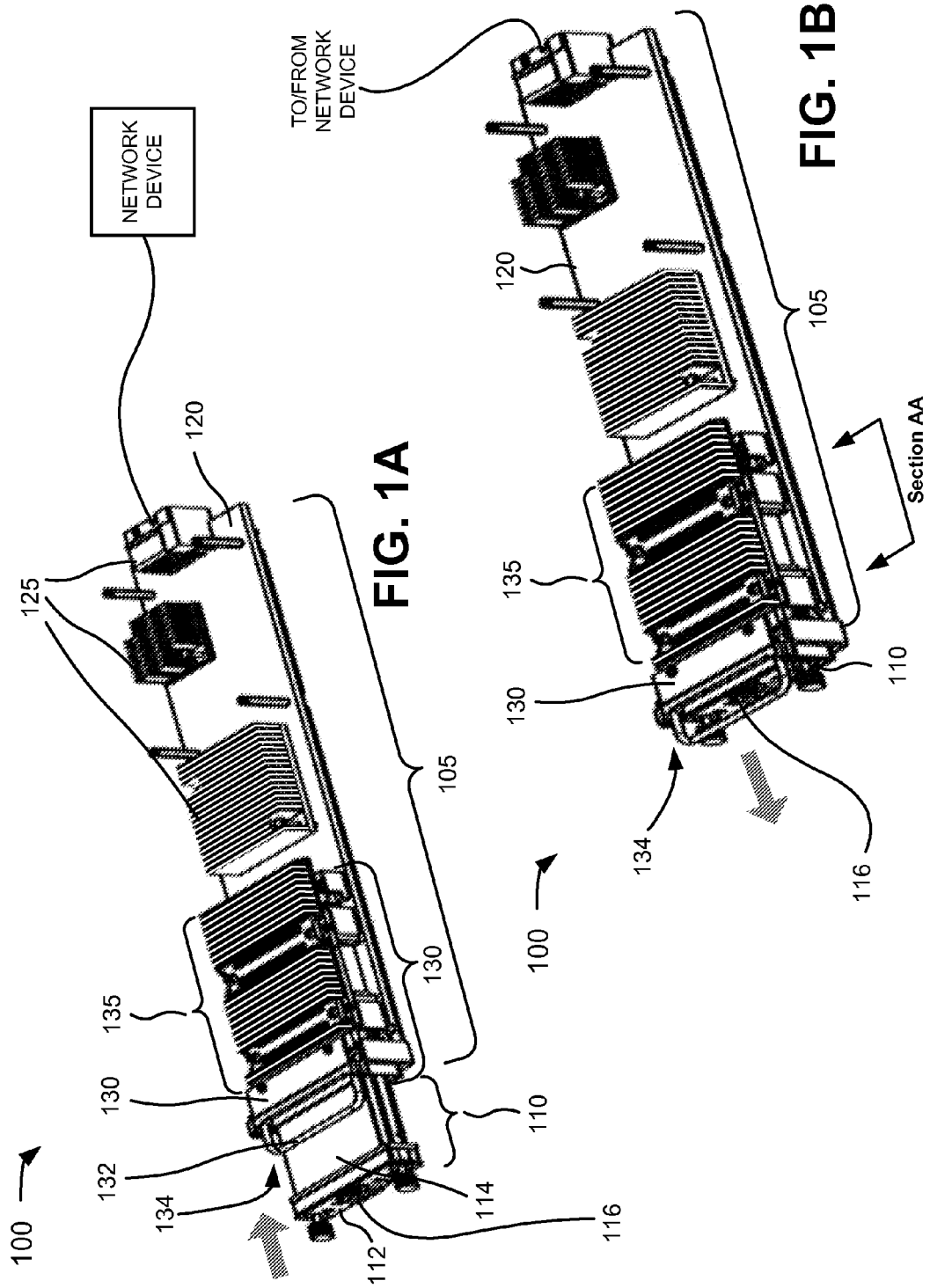

HEAT TRANSFER USING A DURABLE LOW-FRICTION INTERFACE

BACKGROUND

Public and/or proprietary networks carry more and more traffic using network devices that process the traffic at ever increasing bandwidths, data rates, processing speeds, etc. To achieve these bandwidths, data rates, processing speeds, etc., network devices have been equipped with more complex and/or a greater quantity of high performance components, such as higher speed processors, higher capacity switches, faster memories, and/or other components that have improved the performance of the network devices over earlier versions of the network devices.

The high performance components often generate more heat than the components that the high performance components replace. Heat, that is generated by the components, may be transferred to and/or dissipated by heat dissipation devices (e.g., heat sinks, vapor chambers, etc.). Some of the components may be associated with modules (e.g., a C-form-factor pluggable (CFP) optical transceiver, a small form-factor pluggable (SFP) optical transceiver, etc.) that can be installed in and/or removed from network devices. The modules may be installed by being inserted and/or slid into ports associated with the network device.

The ports may include heat dissipation devices that make contact with the components, when the module is installed, that allows the heat to be transferred to the heat dissipation devices. The heat dissipation devices may include a material (e.g., such as a plastic coating or a plastic film) that reduces friction between the components and the heat dissipation devices. The material that reduces the friction may act as an insulator, which reduces a quantity of heat that is transferred between the components and the heat dissipation devices. The material that reduces the friction may also disintegrate over a period of time due to thermal stress, repeated installation and/or de-installation of the module, which may cause an amount of friction, between the components and the heat dissipation devices, to increase. The increased friction may increase an amount of force required to install or remove the module.

The heat dissipation devices may include a thermally conductive material (e.g., such as copper, aluminum, etc.) that allows the heat to be transferred between the components and the heat dissipation devices. The repeated installation and/or de-installation of the modules, and/or contaminants (e.g., dust, metal shavings, etc.) on the components and/or on the thermally conductive material, may cause a surface, associated with the thermally conductive material, to become damaged. The damaged surface may occur as a result of the thermally conductive material becoming galled, grooved, pitted, etc., which may cause an amount of friction, between the components and the heat dissipation devices, to increase. The increased friction may increase an amount of force required to install or remove the module. The damaged thermally conductive material may also reduce an amount of heat that is transferred from the components to the heat dissipation devices.

SUMMARY

According to one aspect, a device may include a removable client module to process data being transmitted or received, by the device, when the client module is installed in the device, where the client module may include a first surface via which heat, that is generated by the client module, is transferred. The device may also include a port into which the client module is inserted to install the client module in the device. The device may further include a heat sink, associated with the port, to dissipate the heat that is received from the first surface, where the heat sink includes a second surface on which a first material is applied, and where the first material may make direct contact with the first surface, when the client module is installed in the device, that allows the heat to be received from the first surface; may conform to an American Society for Testing Materials (ASTM)-b607-91 standard or a United States Military Specification-C-26074; and may transfer the heat to the second surface, that allows the client module to operate at a temperature that is less than an operating threshold.

According to another aspect a system may include a host device that includes a port on which a heat sink is mounted, where the heat sink may include a base via which heat is transferred to the heat sink. The system may also include a client module that is removably installed in the host device via the port, where, when installed in the host device, the client module may cause a thermally conductive material, applied to a surface of the client device, to be in direct contact with the base of the heat sink. Where the thermally conductive material may have characteristics of a thermal conductivity that is greater than approximately eight watts per meter-degrees Kelvin and a coefficient of friction of less than approximately 1.1. Where the thermally conductive material may allow the client module to be installed in or removed from the host device using an amount of force that is less than a first threshold; heat, that is generated by the client module, to be transferred to the heat sink; or the heat sink to dissipate the heat, that is transferred to the heat sink, from the client module, in a manner that allows the client module to operate at a temperature that is less than a temperature threshold.

According to yet another aspect, a device may include a removable optical transceiver that generates heat when processing signals, where the transceiver includes a first surface on which a first material is applied; and a port via which the transceiver is inserted when being installed in the device. The device may also include a heat sink, associated with the port, the heat sink may include a second surface on which a second material is applied, where the second material is electroless nickel. Where the second material may be in direct contact with the first material to create a thermal junction between the transceiver and the heat sink. Where the thermal junction may allow the transceiver to be installed in or removed from the device using an amount of force that is not greater than a first threshold; the transceiver to be repeatedly installed or removed at least one hundred times before the amount of force to install or remove the transceiver becomes greater than the first threshold; and heat transferred to the heat sink, from the transceiver, to be dissipated, which allows the transceiver to operate at a temperature that is less than a threshold.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIGS. 1A and 1B are diagrams of an overview of an installation of a client module into a port, associated with a host device, according to an implementation described herein;

DETAILED DESCRIPTION

Figure 2B:
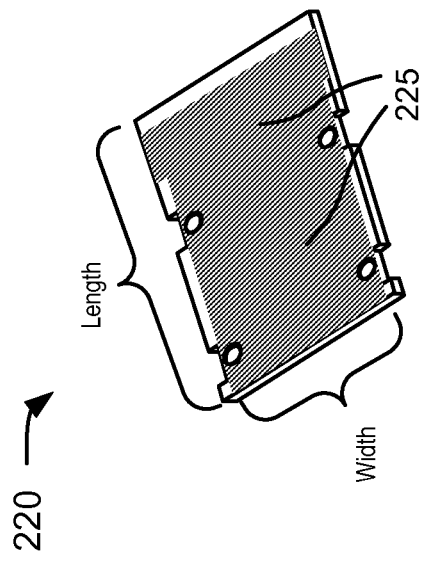
FIGS. 2A and 2B are diagrams of an example heat sink, of FIGS. 1A and 1B, that includes a thermally conductive (TC) material according to an implementation described herein.

The following detailed description refers to the accompanying drawings. The same reference numbers in different drawings may identify the same or similar elements.

A system and/or method, in one example implementation described herein, may enable a thermally conductive (TC) material to be applied to a heat dissipation device and/or module associated with a network device. The TC material may be an electroless nickel plating or a material that conforms to an American Society for Testing Materials (ASTM) standard (e.g., ASTM-B607-91) and/or a United States Military Specification (e.g., MIL-C-26074). The module may correspond to one or more components (e.g., integrated circuits, processors, power supplies, switches, memory devices, etc.) that process signals received from and/or transmitted to the network device. The TC material may allow the module to be installed, in the network device, using an amount of force that is less than a force threshold.

The system and/or method may allow the TC material to be repeatedly installed in or removed from the network device without damaging the material. The TC material may allow the module to be repeatedly installed in or removed from the module using the amount of force, that is less than the force threshold, for a quantity times that is greater than a cycle threshold. The TC material may allow the client module to be installed or removed, using the amount of force, without including an insulating material (e.g., such as a plastic coating or plastic film) between the module and the heat dissipation device. The system and/or method may allow the heat dissipation device to receive and/or dissipate more heat when the TC material is applied than when the TC material is not applied. The system and/or method may allow the heat dissipation device to receive and/or dissipate more heat when the TC material is applied as a replacement for the insulating material.

The force threshold and/or cycle threshold depend on a particular implementation and may vary based on a form of the client module and/or the heat dissipation device, such that thresholds for one form of client module and/or heat dissipation device may differ from thresholds for another form of client module or heat dissipation device. Thus, the description below describes the module as being a C form-factor-pluggable (CFP) optical transceiver module (hereinafter referred to as a "CFP client module") for explanatory purposes. Force thresholds and/or cycle thresholds, identified herein, are thus associated with the CFP client module. In another example implementation, the module may be a small-form-pluggable (SFP) optical transceiver module or some other form of module or component that can be installed or removed from a network device. Force thresholds and/or cycle thresholds, associated with the SFP optical transceiver module or some other form of module or component may differ from the force thresholds and/or cycle thresholds associated with the CFP client module.

FIGS. 1A and 1B are diagrams of an example overview of a client module being installed in a host device, according to an implementation described herein. As shown in FIG. 1A, network device 100 may include a host device 105 and a client module 110.

Host device 105 may include one or more communication and/or computing devices that gather, process, search, store, and/or provide information in a manner described herein. In an example implementation, host device 105 may be an electrical interface between client module 110 and network device 100. For example, host device 105 may receive a signal (e.g., such as a 10 gigabit per second (Gbit/s) signal, a 40 Gbit/s signal, a 100 Gbit/s signal, etc.) from client module 110 and may transmit the signal to a network device (e.g., a node, a switch, a router, a server device, etc.). Host device 105 may also, or alternatively, receive a signal from the network device and may transmit the signal to client module 110.

Host device 105 may include an arrangement of components, such as a base 120, a group of components 125 (hereinafter referred to collectively as "components 125" and individually as "component 125"), a port 130, and a heat sink 135. Base 120 may be constructed of a material of sufficient dimensions and/or rigidity to permit components 125, port 130, and/or heat sink 135 to be mounted. Base 120 may, in one example implementation, be a circuit board on which components 125, port 130, and/or heat sink 135 are mounted, that receives power, that transmits and/or receives signals, etc. Base 120 may, in another example implementation, act as a heat sink base that dissipates heat absorbed from components 125 and/or client module 110.

Component 125 may include a component that processes, receives, and/or transmits signals received from and/or sent to port 130. In one example, component 125 may include a chip that houses an integrated circuit, such as a microprocessor, an application specific integrated circuit (ASIC), a field-programmable gate array (FPGA), etc. Additionally, or alternatively, component 125 may include an interface via which signals may be received from and/or transmitted to a network device and/or a network. Component 125 may generate heat when operating and may include one or more heat sinks to receive and/or dissipate the heat generated by component 125.

Port 130 may enable client module 110 to be installed in host device 105 so that host device 105 can receive and/or transmit signals to client module 110. Port 130 may include a handle 132, attached to port 130, that allows an operator to carry and/or move host device 105. Port 130 may include an aperture 134 that represents an opening, within port 130, via which client module 110 can be inserted when installing client module 110 in host network 105.

Heat sink 135 may include one or more heat dissipation devices that dissipate heat that is generated by client module 110 when installed in port 130. Heat sink 135 may include a heat sink, a vapor chamber, a heat pipe, and/or any other type of heat dissipation device. Heat sink 135 may be mounted to port 130 in a manner that causes heat sink 135 to be in contact with client module 110 when client module 110 is installed in port 130. The contact between heat sink 135 and client module 110 may allow heat sink 135 to receive heat that is generated by client module 110 and to dissipate the heat in a manner that allows client module 110 to operate at a temperature that is less than a threshold.

Client module 110 may include one or more communication and/or computing devices that gather, process, search, store, and/or provide information in a manner described herein. In one example implementation client module 110 may include a CFP client module. In another example implementation, client module 110 may include a SFP optical transceiver module or some other form of module or component. The discussion below describes client module 110 as a CFP client module for explanatory purposes. In another implementation, client module 110 could be a SFP optical transceiver module, a switching device, a processor, a memory device, a power supply, a server device, etc.

Client module 110 may include a collection of components, such as a control panel 112, a heat dissipation surface 114, and/or a transceiver port 116. Control panel 112 may include a display, a light emitting diode (LED), and/or another form of device that displays information associated with a signal (e.g., output power, input power, a data rate, operating temperature, laser bias current, supply voltage, etc.) being received and/or transmitted by client module 110.

Heat dissipation surface 114 may include a surface and/or panel, associated with a chassis that houses components of client module 110, that makes contact with heat sink 135 when client module 110 is installed in port 130. The contact may be characterized by a spring force between heat dissipation surface 114 and heat sink 135. Generally, heat transfer between heat dissipation surface 114 and heat sink 135 may increase as the amount of spring force increases and decrease as the amount of spring force decreases. Transceiver port 116 may include a port and/or interface that allows a transmission line (e.g., an optical fiber and/or some other type of transmission line) to be connected to client module 110 and/or via which a signal is transmitted to and/or received from the transmission line.

Client module 110 may receive a signal, from a transmission line (e.g., from an optical fiber via transceiver port 116) and may re-transmit the signal to host device 105. The signal may be re-transmitted in a manner that conforms to a data rate and/or protocol that is predetermined by an operator of host device 105 and/or a network device to which host device 105 is connected. Client module 110 may also, or alternatively, receive another signal from host device 105 and may re-transmit the other signal to a network via a transmission line. The other signal may be transmitted in a manner that conforms to a data rate (e.g., such as a 10 Gbit/s signal, a 40 Gbit/s signal, a 100 Gbit/s signal, etc.) and/or protocol that is predetermined by an operator of client module 110 and/or a network with which client module 110 is connected via the transmission line.

Client module 110 may be installed, in host device 105, to establish a mechanical, electrical, and/or optical connection with host device 105. Client module 110 may, for example, be inserted into port 130, via aperture 134, until client module 110 is completely inserted into port 130 and/or cannot be slid further using the force. An operator, of client module 110, may apply a force (e.g., as shown by the arrow pointing to the right in FIG. 1A), to client module 110, that causes client module 110 to slide into port 130. The amount of the force may be sufficient to overcome friction between client module 110 and port 130 (e.g., between a heat dissipation surface 114 and heat sink 135).

As shown in FIG. 1B, client module 110 may be installed within host device 105. The installed client module 110 may allow signals to be transported between client module 110 and host device 105 via the connection. Additionally, or alternatively, installing client module 110, in host device 105, may allow heat sink 135 to make contact with client module 110 (e.g., via heat dissipation surface 114). The contact between heat sink 135 and heat dissipation surface 114 may form a thermal junction between heat sink 135 and heat dissipation surface 114. The thermal junction, between heat sink 135 and heat dissipation surface 114, may allow heat, that is generated by client module 110, to be transferred to and/or dissipated by heat sink 135.

Client module 110 may be removed from host device 105 which causes the mechanical, electrical, and/or optical connection to be broken between client module 110 and host device 105. Client module 110 may be de-installed by removing client module 110 from port 130. For example, an operator, associated with client module 110 may slide client module 110, in the direction of the arrow pointing to the left (in FIG. 1B), until client module 110 is removed from port 130 via aperture 134. The operator may cause client module 110 to slide out of port 130 by applying an amount of force, generally in the direction of the arrow pointing to the left, that is sufficient to overcome the friction between client module 110 and port 130 and/or between heat dissipation surface 114 and heat sink 135.

The friction between heat dissipation surface 114 and heat sink 135 may be reduced when the TC material is applied to heat sink 135. Applying the TC material to heat sink 135 may cause the TC material to make contact with heat dissipation surface 114 when client module 110 is installed in host device 105. Reducing the friction, may cause the amount of force to be reduced to the level that is less than the force threshold. Additionally, or alternatively, applying the TC material, to heat sink 135, may increase a quantity of heat that is transferred, via the thermal junction between heat dissipation surface 114 and heat sink 135, to heat sink 135 to be dissipated.

Client module 110 may be repeatedly installed in (e.g., in a manner similar to that described above with respect to FIG. 1A) and/or removed from (e.g., in a manner similar to that described above with respect to FIG. 1B) host device 105 over a time period. Repeatedly installing and removing client module 110 may damage heat dissipation surface 114 and/or heat sink 135. The damage to heat dissipation surface 114 and/or heat sink 135 may cause the friction between heat dissipation surface 114 and heat sink 135 to increase. In one example, the increase in the friction may cause the amount of force used to install or remove client module 110 to increase to a quantity that is greater than the maximum force.

The friction between heat dissipation surface 114 and heat sink 135 may be reduced when a TC material is applied to heat sink 135. Reducing the friction, may cause the amount of force, sufficient to install or remove client module 110, to be reduced to a level of force that is less than the maximum level of force.

The number of devices and/or components, illustrated in FIGS. 1A and 1B, are provided for explanatory purposes only. In practice, there may be additional devices and/or components; fewer devices and/or components; different devices and/or components; or differently arranged devices and/or components than illustrated in FIGS. 1A and 1B.

Also, in some implementations, one or more of the devices and/or components of network device 100 may perform one or more functions described as being performed by another one or more of the devices of network device 100. Devices and/or components of network device 100 may interconnect via wired connections, wireless connections, or a combination of wired and wireless connections.

Figure 2A:
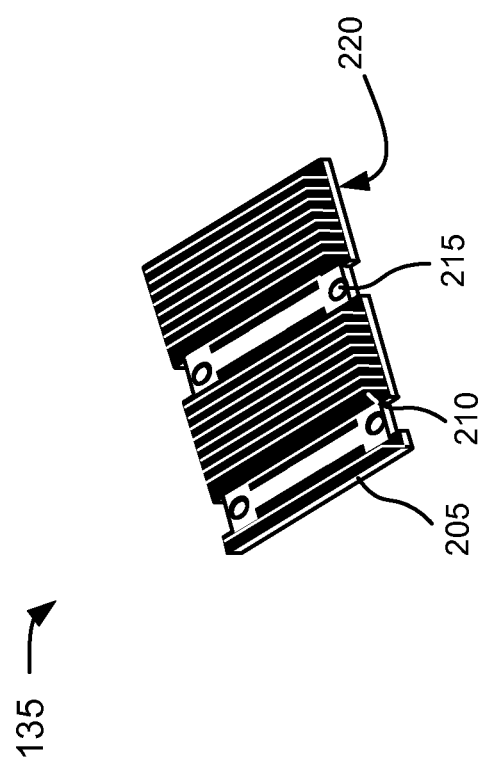

FIGS. 2A and 2B are diagrams of an example heat sink 135 that includes a TC material according to an implementation described herein. Heat sink 135 may include a collection of components, such as a heat sink base 205, a set of fins 210 (hereinafter referred to collectively as "fins 210" and individually as "fin 210"), a set of mounting holes 215 (hereinafter referred to collectively as "holes 215" and individually as "hole 215"), and/or a contact surface 220.

Heat sink base 205 may be made of a material of sufficient dimensions and/or rigidity to allow heat sink 135 to be installed on port 130 and/or to allow fins 210 to be attached to heat sink base 205. Heat sink base 205 may include a first side to which fins 210 are attached. Heat sink base 205 may include a second side, that corresponds to contact surface 220, that makes contact with client module 110 when installed within port 130. Heat sink base 205 may absorb and/or dissipate heat that is generated by client module 110 when installed within port 130. Heat sink base 205 and/or fins 210 may be made of a material, such as copper, aluminum, etc., that is capable of absorbing and/or conducting heat. For example, heat sink base 205 and/or fins 210 may be made of a thermally conductive material that has a coefficient of thermal conductivity that is less than a threshold.

Fins 210 may include a group of plates that are secured to heat sink base 205. Fins 210 may be secured to heat sink base 205 in a manner that enables fins 210 to absorb heat from heat sink base 205 and/or to distribute the heat throughout a volume and/or surface area of each of fins 210. Fins 210 may be configured in a manner that maximizes a surface area via which the heat may be transferred into the environment, such as the atmosphere or a fluid (e.g., as in a radiator, etc.), while ensuring enough durability to withstand damage caused by tools, solvents, etc. Hole 215 may be an opening, within heat sink base 205 via which heat sink 135 is mounted to port 130 and/or base 120 (e.g., using one or more fasteners).

As shown in FIG. 2B, contact surface 220 may include a TC material 225 (hereinafter referred to as material 225) that is applied to contact surface 220 (e.g., shown as a shaded area of contact surface 220). Material 225 may be applied to contact surface 220 with a thickness that is generally uniform throughout an area of coverage. In an example implementation, material 225 may include an electroless nickel plating. In another example implementation, material 225 may include a material that conforms to an American Society for Testing Materials (ASTM) standard (e.g., ASTM-B607-91) and/or a United States Military Specification (e.g., MIL-C-26074).

Material 225 may be applied, to contact surface 220, in a manner that covers all or a portion of contact surface 225. The thickness, associated with material 225, may fall within a particular range (e.g., from a minimum of 150 mils to a maximum of 250 mils). A maximum coverage area, associated with material 225, may generally be based on dimensions of contact surface 225 (e.g., based on length and/or width dimension). In one example, the maximum coverage area for contact surface 220, associated with a particular client module 110 (e.g. a CFP client module), may be based on a length (e.g., 4.2 inches (in.)) and a width (e.g., 2.75 in.) associated with contact surface 220.

Material 225 may be associated with a thermal conductivity that is greater than a conductivity threshold. In one example, contact surface 220 may be made of a particular material (e.g., aluminum, anodized aluminum, etc.). The conductivity threshold may be based on a particular thermal conductivity (e.g., 1.3 Watts/meter-degrees Kelvin (W/m-° K)) associated with the particular material. Applying material 225 may allow a thermal conductivity, associated with contact surface 220, to be increased to a level that is greater than the particular coefficient of thermal conductivity. In one example, material 225 may include a material (e.g., an electroless nickel plating and/or some other material) associated with a thermal conductivity (e.g., 8 W/m-° K) that is greater than the particular thermal conductivity associated with contact surface 220.

In another example, the thermal conductivity may be greater than a thermal conductivity associated with a insulating material that can be applied to contact surface 220, and/or heat dissipation surface 114, to reduce friction between heat dissipation surface 114 and contact surface 220. Examples of the insulating material include a polyimide material (e.g., such as a Kapton® film associated with a thermal conductivity of 0.3 W/m-° K), a polyester material (e.g., such as Mylar® film associated with a thermal conductivity of 0.07 W/m-° K), etc.

Material 225 may be associated with a coefficient of friction that is less than a friction threshold. The friction threshold may be based on a particular coefficient of friction (e.g., 1.3) associated with the particular material from which contact surface 220 is made (e.g., anodized aluminum, etc.). Applying material 225, to contact surface 220, may allow the coefficient of friction, associated with contact surface 220, to be decreased to a level that is less than the particular coefficient of friction. In one example, material 225 may include an electroless nickel plating and/or some other material associated with a coefficient of friction (e.g., 1.1) that is less than the particular coefficient of friction associated with contact surface 220.

Reducing the size of the coverage area of material 225, relative to contact surface 220, to an area that is less than the maximum coverage area may reduce an effective thermal conductivity associated with contact surface 220. The effective thermal conductivity, associated with the contact surface 220, may be based on a weighted average of a first thermal conductivity, associated with material 225, multiplied by a first constant, and a second thermal conductivity, associated with the material from which contact surface 220 is made, multiplied by a second constant. The first constant may be based on a coverage area, associated with material 225, divided by a total area associated with contact surface 220. The second constant may be based on an area, associated with contact surface 220 and that is not covered by material 220, divided by the total area associated with contact surface 220.

Thus, the effective thermal conductivity may be maximized, with respect to contact surface 220, when a coverage area, associated with material 225, corresponds to the maximum coverage area. Additionally, or alternatively, the maximum coverage area, associated with material 225, may correspond to a maximum amount of heat that can be transferred via the thermal junction between heat dissipation surface 114 and contact surface 220. The maximum amount of heat that is transferred via the thermal junction may correspond to a maximum amount of heat that is dissipated by heat sink 135.

Reducing the size of the coverage area of material 225, relative to contact surface 220, to an area that is less than the maximum coverage area may also, or alternatively, increase an effective coefficient of friction associated with contact surface 220. The effective coefficient of friction, associated with the contact surface 220, may be based on a weighted average of a first coefficient of friction, associated with material 225, multiplied by the first constant, and a second coefficient of friction, associated with the particular material from which contact surface 220 is made, multiplied by the second constant. Thus, the effective coefficient of friction may be minimized, with respect to contact surface 220, when a coverage area, associated with material 225, corresponds to the maximum coverage area.

Additionally, or alternatively, the maximum coverage area, associated with material 225, may correspond to a minimum amount of force to be used to install client module 110 in and/or remove client module 110 from host device 105. In other words, reducing the size of the coverage area, may increase a quantity of friction between heat dissipation surface 114 and contact surface 220. Increasing the quantity of friction may cause an amount of force, associated with installing or removing client module 110, to increase to a level that is greater than a maximum force threshold.

Material 225 may include other characteristics (e.g., hardness, malleability, etc.) that correspond to a level of durability or damage resistance associated with material 225. The level of durability, associated with material 225 may allow material 225 to resist permanent damage (e.g., becoming permanently galled, pitted, grooved, etc.) when repeatedly installing and/or removing client module 110 from host device 105. The measure of durability may allow the effective coefficients of thermal conductivity and/or friction to be maintained over a period of time. Also, or alternatively, the level of durability, associated with material 225 may allow client module 110 to be installed, in host device 105, without using a insulating material (e.g., such as Kapton®, Mylar®, etc.) that can be applied to contact surface 220 and/or heat dissipation surface 114.

Figure 3:
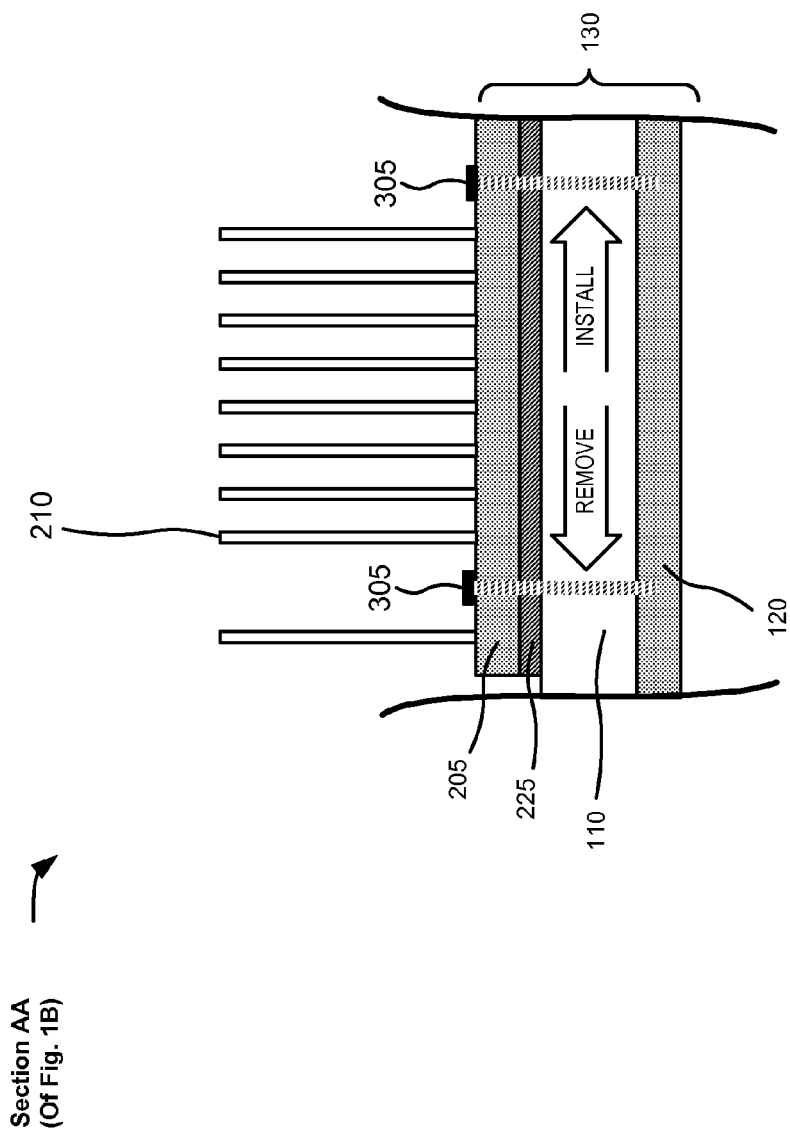
FIG. 3 is a diagram of an example client module that has been installed in a port, associated with a host device, according to an implementation described herein.

FIG. 3 is a diagram of client module 110 that has been installed in host device 105, according to an implementation described herein. As shown in FIG. 3, side view section AA (FIG. 1B), corresponds to a side view of a portion of host device 105 with client module 110 installed within port 130. The portion of host device 105 may include a portion of heat sink 135 (e.g., represented by heat sink base 205, fins 210, and material 225), a portion of base 120, and/or fasteners 305. Fastener 305 may allow heat sink 135 to be mounted to host device 105. Fasteners 305 may also, or alternatively, allow a particular spring force to be applied between heat sink 135 and client module 110. Fasteners 305, in one example implementation, may include springs that allow the spring force to be maintained at a level that is greater than a minimum threshold (e.g., approximately equal to 2.5 lbs. for a CFP client module) and/or less than a maximum threshold (e.g., approximately equal to 4.0 lbs. for a CFP client module).

Client module 110 may be installed by moving (e.g., in the a direction of the arrow labeled "install") client module 110 in a manner that causes client module 110 to be inserted between base 120 and heat sink base 205. Heat sink base 205 may include material 225 (e.g., applied to contact surface 220) that makes contact with client module 110 (e.g., heat dissipation surface 114) when client module 110 is installed in host device 105. Material 225 may allow client module 110 to be installed (e.g., in the direction of the arrow labeled "install") and/or removed (e.g., in the direction of the arrow labeled "remove") using an amount of force that is less than a force threshold. The amount of force may be approximated based on the spring force multiplied by an average of the coefficients of friction between material 225 and a material from which heat dissipation surface is made.

In one example, for a particular type of client module 110 (e.g., a CFP client module), material 225 may allow the particular type of client module 110 to be repeatedly installed and/or removed (e.g., up to 100 times) using a first amount of force that is less than first force threshold (e.g., a first amount of force that is less than approximately 12 lbs.). Additionally, or alternatively, material 225 may allow the particular type of client module 110 to be repeatedly installed and/or removed a quantity of times (e.g., from 101 times to approximately 200 times) using a second amount force that is less than a second force threshold (e.g., approximately equal to 18 lbs.).

Additionally, or alternatively, material 225 may allow client module 110 to be installed, in host device 105, without using a insulating material to reduce the amount of force, to install and/or remove client module 110, to a level that is less than the first force threshold. Material 225 may also, or alternatively, allow a quantity of heat, that is generated by client module 110, to be transferred to, and/or dissipated by, heat sink 135 in a manner that allows client module 110 to operate at a temperature that is less than a temperature threshold. The quantity of heat may be greater than another quantity of heat that is transferred to, and/or dissipated by, heat sink 135 when material 225 is not applied to contact surface 220 and/or when the insulating material is included between contact surface 220 and/or heat dissipation surface 114.

Figure 4:
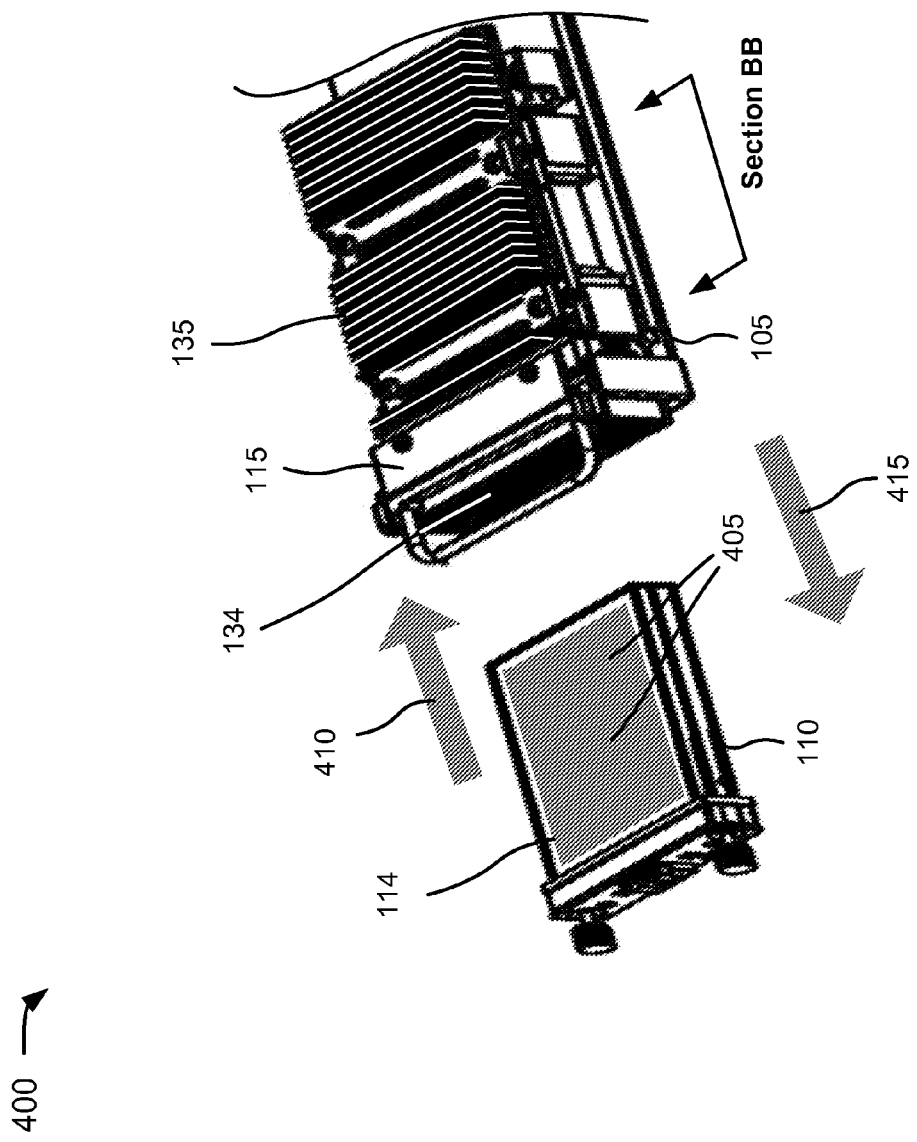
FIG. 4 is diagram of an example installation of a client module, that includes a TC material, into a port, associated with a host device, according to an implementation described herein.

FIG. 4 is diagram of an example installation of client module 110, that includes a TC material, into host device 105, according to an implementation described herein. As shown in FIG. 4, network device 400 may include a host device 105 and a client module 110. Host device 105 may include heat sink 135 on which material 225 has been applied (e.g., applied to heat sink base 205) in a manner similar to that described above with respect to FIGS. 2B and 3. Client module 110 may include material 405 that has been applied to all or a portion of heat dissipation surface 114 (e.g., shown as a shaded area of heat dissipation surface 114). Material 405 may be applied to heat dissipation surface 114 with a thickness that is generally uniform throughout an area of coverage (e.g., from approximately 150 mils to approximately 250 mils). Material 405 may, in an example implementation, be an electroless nickel plating. In another example implementation, material 405 may be a material that conforms to the ASTM standard (e.g., ASTM-B607-91) and/or the Military Specification (e.g., MIL-C-26074). Material 405 may, in one example, be the same material as material 225. Material 405 may, in another example, be a different material than material 225. In either example, material 405 may conform to the ASTM standard and/or the Military Specification.

Material 405 may be applied, to heat dissipation surface 114, in a manner that covers all or a portion of heat dissipation surface 114. The thickness, associated with material 405, may fall within a particular range (e.g., from a minimum of 150 mils to a maximum of 250 mils). A maximum coverage area, associated with material 405, may generally be based on dimensions of heat dissipation surface 114 (e.g., based on length and/or width dimensions). In one example, the maximum coverage area of material 405, with respect to heat dissipation surface 114, may be equal to or greater than the maximum coverage area of material 225 (e.g., an area that corresponds to a length of at least 4.2 in. and a width of at least 2.75 in.) with respect to contact surface 220.

Material 405 may, in manner similar to that described above with respect to material 225 of FIG. 2B, be associated with a coefficient of thermal conductivity that is greater than a conductivity threshold. In one example, heat dissipation surface 114 may be made of a particular material (e.g., aluminum, anodized aluminum, etc.). The conductivity threshold may be based on a particular coefficient of thermal conductivity (e.g., 1.3 Watts/meter-degrees Kelvin (W/m-° K)) associated with the particular material. Applying material 405 may allow a coefficient of thermal conductivity, associated with heat dissipation surface 114, to be increased to a level that is greater than the particular coefficient of thermal conductivity. In one example, material 405 may include a material (e.g., an electroless nickel plating and/or some other material) associated with a thermal conductivity (e.g., 8 W/m-° K) that is greater than the particular coefficient of thermal conductivity associated with heat dissipation surface 114.

In another example, the coefficient of thermal conductivity may be greater than another coefficient of thermal conductivity associated with a insulating material (e.g., Kapton®, Mylar®, etc.) that is sometimes applied to contact surface 220 and/or heat dissipation surface 114 to reduce friction between heat dissipation surface 114 and contact surface 220.

Material 405 may be associated with a coefficient of friction that is less than a friction threshold. The friction threshold may be based on a particular coefficient of friction (e.g., 1.3) associated with the particular material from which heat dissipation surface 114 is made. Applying material 405, to heat dissipation surface 114, may allow the coefficient of friction, associated with heat dissipation surface 114, to be decreased to a level that is less than the particular coefficient of friction. In one example, material 405 may include a material (e.g., an electroless nickel plating and/or some other material) associated with a coefficient of friction (e.g., 1.1) that is less than the particular coefficient of friction associated with contact surface 220.

Reducing the size of the coverage area, of material 405 with respect to heat dissipation surface 415, to an area that is less than the maximum coverage area may reduce an effective coefficient of thermal conductivity associated with heat dissipation surface 114. The effective coefficient of thermal conductivity, associated with heat dissipation surface 114, may, in a manner similar to that described above with respect to FIG. 2B, be based on a weighted average of a coefficient of thermal conductivity, associated with material 405 and a second coefficient of thermal conductivity associated with a material from which heat dissipation surface 114 is made.

Thus, the effective coefficient of thermal conductivity may be maximized, with respect to heat dissipation surface 114, when a coverage area, associated with material 405, corresponds to the maximum coverage area. Additionally, or alternatively, the maximum coverage area, associated with material 405, may correspond to a maximum amount of heat that can be transferred via the thermal junction between heat dissipation surface 114 and contact surface 220.

Reducing the size of the coverage area, of material 405 relative to heat dissipation surface 114, may also, or alternatively, increase an effective coefficient of friction associated with heat dissipation surface 114. The effective coefficient of friction, associated with heat dissipation surface 114, may, in a manner similar to that described in FIG. 2B, be based on a weighted average of a first coefficient of friction associated with an area, of heat dissipation surface 114, that is covered by material 405 and a second coefficient of friction associated with another area, of heat dissipation surface 114, that is not covered by material 405.

Additionally, or alternatively, the maximum coverage area, associated with material 405, may correspond to a minimum amount of force to be used to install (e.g., in the direction of arrow 410) client module 110 in and/or remove (e.g., in the direction of arrow 415) client module 110 from host device 105. In other words, reducing the size of the coverage area may increase a quantity of friction between heat dissipation surface 114 and contact surface 220. Increasing the quantity of friction may cause an amount of force, associated with installing or removing client module 110, to increase to a level that is greater than a maximum force threshold (e.g., 18 lbs. when client module 110 corresponds to a CFP module).

Material 405 may include other characteristics (e.g., hardness, malleability, etc.) that correspond to a level of durability or damage resistance associated with material 405. The level of durability, associated with material 405 may allow material 405 to resist permanent damage (e.g., becoming permanently galled, pitted, grooved, etc.) when repeatedly installing and/or removing client module 110 from host device 105. The measure of durability may allow the effective coefficients of thermal conductivity and/or friction to be maintained over a period of time. Also, or alternatively, the level of durability, associated with material 405 may allow client module 110 to be installed, in host device 105, without using a insulating material (e.g., such as Kapton®, Mylar®, etc.) that is sometimes applied to contact surface 220 and/or heat dissipation surface 114.

Figure 5:
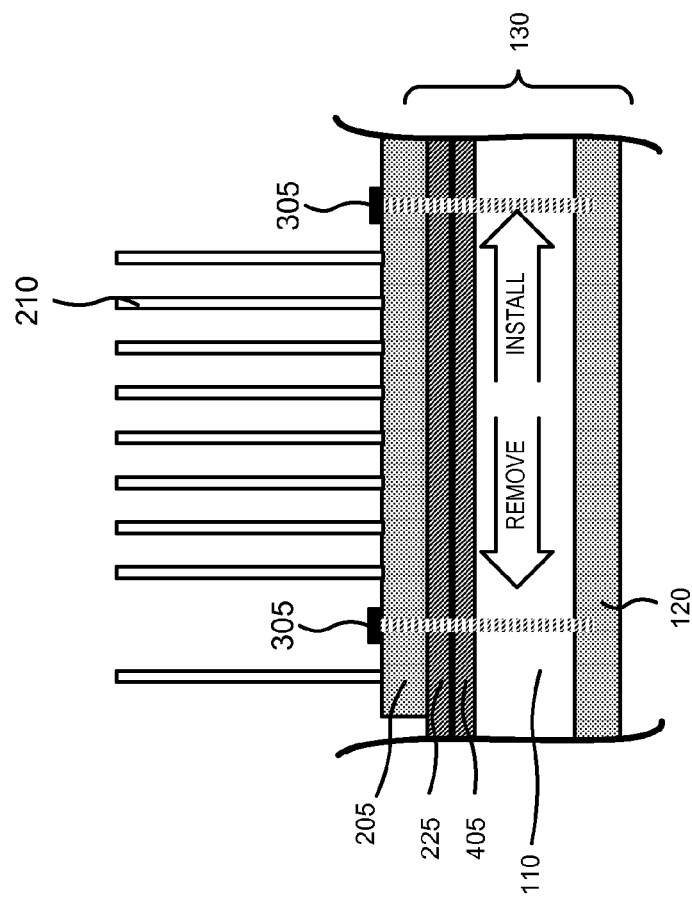
FIG. 5 is diagram of an example client module, that includes a TC material, that is installed in a port, associated with host device, according to an implementation described herein.

FIG. 5 is diagram of client module 110, that includes a TC material, that is installed in host device 105, according to an implementation described herein. As shown in FIG. 5, side view section BB (FIG. 4), corresponds to a side view of a portion of host device 105 with client module 110 installed within port 130. The portion of host device 105 may include a portion of heat sink 135 (e.g., represented by heat sink base 205, fins 250, and material 225), a portion of base 120, and/or fasteners 305. In another example implementation, host device 105 may not include material 225.

Client module 110 may include material 405 (e.g., applied to heat dissipation surface 114). Heat sink base 205 may include material 225 (e.g., applied to contact surface 220 of heat sink base 205). Client module 110 may be installed by moving (e.g., in a direction of the arrow labeled as "install") client module 110 in a manner that causes client module 110 to be inserted between base 120 and heat sink base 205. Installing client module 110 may cause material 405 to make contact with (e.g., by sliding, rubbing, etc.) material 225. Material 405 and/or material 225 may allow client module 110 to be installed or removed (e.g., in a direction of the arrow labeled as "remove") using an amount of force that is less than the force threshold.

A first amount of force, to install or remove client module 110 when material 405 and material 225 are applied, may be less than a second amount of force to install or remove client module 110 when material 405 is not applied and material 225 is applied. The first amount of force may be approximated based on the spring force (e.g., between material 225 and material 405) multiplied by a first average of the coefficients of friction associated with material 225 and material 405. The second amount of force may be approximated based on the spring force multiplied by a second average of the coefficients of friction associated with material 225 and a material from which heat dissipation surface 114 is made (e.g., aluminum, anodized aluminum, etc.). The first force may be less than the second force based on the first average of the coefficients friction being less than the second average of the coefficients of friction.

Material 405 and material 225 may also, or alternatively, allow a quantity of heat, that is generated by client module 110, to be transferred to, and/or dissipated by, heat sink 135 in a manner that allows client module 110 to operate at a temperature that is less than a temperature threshold. For example, a first amount of heat that is permitted to transfer via a first thermal junction (e.g., between material 225 and material 405) may be greater than a second amount of heat that is permitted to transfer via a second thermal junction that does not include material 405 (e.g., between material 225 and heat dissipation surface 114). The first amount of heat may be greater than the second amount of heat when a first value, based on coefficients of thermal conductivity with respect to materials associated with the first junction, is greater than a second value, that is based on coefficients of thermal conductivity with respect to materials associated with the second junction. The first value and/or second value may be computed based on a mathematical function associated with the respective coefficients of thermal conductivity (e.g., a sum, an average, a difference, etc.). The first amount of heat, that is transferred via the first thermal junction, may permit client module 110 to operate at a temperature that is less than another temperature when the second thermal junction is used. The first amount of heat may also permit client module 110 to operate at a temperature that is less than a temperature threshold.

In another example implementation, client module 110 may be installed, in host device 105 in a manner that includes material 405 applied to heat dissipation surface 114 and does not include material 225 applied to contact surface 220. Installing client module 110 may cause material 405 to make contact with (e.g., by sliding, rubbing, etc.) contact surface 220. Material 405 may allow client module 110 to be installed or removed using an amount of force that is less than the maximum force threshold (e.g., 18 lbs. when client module 110 corresponds to a CFP module). Material 405 may also, or alternatively, allow a quantity of heat, that is generated, by client module 110, to be transferred to, and/or dissipated by, heat sink 135 in a manner that allows client module 110 to operate at a temperature that is less than a temperature threshold.

In yet another example implementation, material 225 and/or material 405 may be applied to all or a portion of contact surface 220 and/or heat dissipation surface 114, respectively, in a variety of way. In one example, material 405 may be applied to first portion of heat dissipation surface 114 that makes contact with a first portion of contact surface 220, that does not include material 225, when client module 110 is installed in host device 105. Additionally, or alternatively, material 225 may be applied to a second portion contact surface 220 that makes contact with a second portion of heat dissipation surface 114, that does not include material 405, when client module 110 is installed in host device 105. Additionally, or alternatively, material 405 may be applied to a third portion of heat dissipation surface 114 that makes contact with the first portion or the second portion contact surface 220 when client module 110 is installed in host device 105.

The variety of combinations of coverage schemes of material 225 and/or material 405 on contact surface 220 and/or heat dissipation surface 114, respectively, may enable client module 110 to be installed in and/or removed from host device 105 using a quantity of force that is less than a force threshold.

For a particular type of client module 110 (e.g., a CFP client module), the variety of combinations of coverage schemes may, for example, allow the particular type of client module 110 to be repeatedly installed and/or removed (e.g., up to 100 times) using a first amount of force that is less than a first force threshold associated with the particular type of client module 110 (e.g., a force that is less than approximately 12 lbs.). Additionally, or alternatively, the variety of combinations of coverage schemes may allow the particular type of client module 110 to be repeatedly installed and/or removed another quantity of times (e.g., between 101 to approximately 200 times) using a second amount force that is less than a second force threshold associated with the particular type of client module 110 (e.g., approximately equal to 18 lbs.).

A system and/or method, described herein, may enable a heat dissipation device, associated with port within a host device, to dissipate heat that is generated by a client module that is installed in the port. The system and/or method may allow a TC material to be applied to the heat dissipation device and/or the client module in a manner that allows an amount of friction, between the module and the heat dissipation device, to be reduced to a level that is less than a friction threshold. Reducing the amount of friction, to the level that is less than the friction threshold, may allow the client module to be installed in, or removed from, the host device using an amount of force that is less than a force threshold.

The system and/or method may allow the TC material to be applied to a heat dissipation device in a manner that allows a client module to be installed in a host device without using a insulating material. Installing the client module, without using the insulating material, may allow the heat dissipation device to dissipate more heat than is dissipated when the client module is installed using the insulating material.

The system and/or method may allow the client module to be repeatedly installed in, or removed from, the host device without damaging the TC material. Not damaging the TC material may allow the client module to be repeatedly installed or removed using an amount of force that is less than a force threshold. Not damaging the TC material may also allow the heat dissipation device to dissipate sufficient heat to allow the client module to operate at a temperature that is less than a threshold.

The foregoing description provides illustration and description, but is not intended to be exhaustive or to limit the embodiments to the precise form disclosed. Modifications and variations are possible in light of the above teachings or may be acquired from practice of the embodiments.

For example, while the foregoing description describes the embodiments in a context associated with a network device and/or network environment, the embodiments, described herein, may also apply to a non-network environment.

Even though particular combinations of features are recited in the claims and/or disclosed in the specification, these combinations are not intended to limit the disclosure of the embodiments. In fact, many of these features may be combined in ways not specifically recited in the claims and/or disclosed in the specification.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A device comprising:
   a removable client module to process data being transmitted or received, by the device, when the client module is installed in the device,
   where the client module includes a first surface via which heat, that is generated by the client module, is transferred;
   a port into which the client module is inserted to install the client module in the device; and
   a heat sink, overlying the port, to dissipate the heat that is received from the first surface, where the heat sink includes a base having a second surface on which a first material is applied, a second material provided on the first surface, both the first and second materials including electroless plated nickel, and where the first material:
   makes direct contact with the second material, when the client module is installed in the device, that allows the heat to be received from the first surface,
   where the first material complies with an American Society for Testing Materials (ASTM)-B607-91 standard or a United States Military Specification-C-26074, and
   transfers the heat to the second surface, that allows the client module to operate at a temperature that is less than an operating threshold.

2. The device of claim 1, where the first material allows the client module to be inserted in, or removed from, the port using a force that is less than a first threshold.

3. The device of claim 2, where the first material allows the client module to be inserted in, or removed from, the port without using a third material, the third material being an insulating material based on a polyimide material or a polyester material.

4. The device of claim 2, where the first material allows the client module to be repeatedly inserted in or removed from the port at least one hundred times before the force increases to a level that is not less than the first threshold.

5. The device of claim 2, where the first material allows the client module to be repeatedly inserted in or removed from the port at least 200 times before the force increases to another level that is not less than a second threshold, the second threshold being greater than the first threshold.

6. The device of claim 1, where the first material has a thermal conductivity greater than seven watts/meter-degrees Kelvin and a coefficient of friction less than approximately 1.1.

7. The device of claim 1, where the first material is applied to the second surface with a uniform thickness, where the uniform thickness is in a range from 150 mils to 250 mils.

8. The device of claim 1, where a first quantity of the heat that is transferred to the second surface is greater than a second quantity of the heat that would be transferred to the second surface:
when the first material is not applied to the second surface, or
when an insulating material is included between the first surface and second surface, where the insulating material includes a polyimide or a polyester material.

9. The device of claim 1, where the first material allows the client module to be inserted in or removed from the port without becoming permanently galled, pitted, or grooved due to friction or contaminants between the first surface and the first material.

10. A system comprising:
a host device that includes a port on which a heat sink is mounted, where the heat sink includes a base via which heat is transferred to the heat sink; and
a client module that is removably installed in the host device and via the port, where, when installed in the host device, the client module causes a thermally conductive material, applied to a surface of the client module having a first electroless plated nickel, to be in direct contact with the base of the heat sink having a second electroless plated nickel,
where the thermally conductive material has characteristics of:
a thermal conductivity that is greater than approximately eight watts per meter-degrees Kelvin, and
a coefficient of friction that is less than approximately 1.1, and
where the thermally conductive material allows:
the client module to be installed in or removed from the host device using an amount of force that is less than a first threshold,
heat, that is generated by the client module, to be transferred to the heat sink, or
the heat sink to dissipate heat, that is transferred to the heat sink from the client module, in a manner that allows the client module to operate at a temperature that is less than a temperature threshold.

11. The system of claim 10, where the thermally conductive material allows the client module to be installed in or removed from the host device at least one hundred times without the amount of force increasing to a level that is not less than the first threshold.

12. The system of claim 10, where the client module corresponds to a C-form-factor pluggable (CFP) module that processes signals received from or sent to the host device.

13. The system of claim 12, further comprising one or more fasteners that impart an amount of spring force, between the thermally conductive material and the base of the heat sink, in a range from 2.5 pounds to 4 pounds, and
where the spring force allows the material to make contact with the surface without causing the client module to be installed or removed using a force that is not less than the first threshold.

14. The system of claim 9, where the thermally conductive material being in contact with the base of the heat sink allows a first amount of friction, associated with installing the client module, to be less than a second amount of friction, associated with installing the client module when the surface of the client module does not include the material.

15. A device comprising:
a removable optical transceiver that generates heat when processing signals, where the transceiver includes a first surface on which a first material electroless plated nickel is applied;
a port via which the transceiver is inserted when installed in the device;
a heat sink, associated with the port, the heat sink including a base having a second surface on which a second material is applied including electroless plated nickel, where the second material is electroless nickel,
where the second material is in direct contact with the first material to create a thermal junction between the transceiver and the heat sink, and where the thermal junction allows:
the transceiver to be installed in or removed from the device using an amount of force that is not greater than a first threshold,
the transceiver to be repeatedly installed or removed at least one hundred times before the amount of force, to install or remove the transceiver, becomes greater than the first threshold, or
heat transferred to the heat sink, from the transceiver, to be dissipated which allows the transceiver to operate at a temperature that is less than a threshold.

16. The device of claim 15, where the first material conforms to an American Society for Testing Materials (ASTM)-B607-91 standard, or conforms to a United States Military Specification-C-26074.

17. The device of claim 15, where the thermal junction includes:
the first material that covers a first portion of the first surface,
the second material that covers a first portion of the second surface, where the second material, that covers that first portion of the second surface:
is in contact with a second portion of the first surface that is not covered by the first material, and
is not in contact with the first portion of the first surface that is covered by the first material.

18. The device of claim 15, where the thermal junction includes:
the first material that covers a first portion of the first surface, the second material that covers a first portion of the second surface, where the second material, that covers that first portion of the second surface:
is in contact with a second portion of the first surface that is not covered by the first material and
is in contact with the first portion of the first surface that is covered by the first material.

19. The device of claim 15, where a thermal conductivity, associated with the first surface, is based on:
- a first thermal conductivity associated with the first material and a first area, associated with the first surface, that is covered by the first material, and
- a second thermal conductivity associated with a third material from which the first surface is made and a second area, associated with the first surface, that is not covered by the first material.

20. The device of claim 18, where the first thermal conductivity is greater than the second thermal conductivity, and
where the first thermal conductivity increases as a size of the first area, that is covered by the first material, increases.

21. The device of claim 18, where a coefficient of friction, associated with the first surface, is based on:
- a first coefficient of friction associated with the first material and a first area, associated with the first surface, that is covered by the first material, and
- a second coefficient of friction associated with a third material from which the first surface is made and a second area, associated with the first surface, that is not covered by the first material.

22. The device of claim 21, where the first coefficient of friction is less than the second coefficient of friction, and
where coefficient of friction decreases as a size of the first area, that is covered by the first material, increases.

* * * * *